(12) United States Patent
Kim et al.

(10) Patent No.: US 9,324,772 B2
(45) Date of Patent: Apr. 26, 2016

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Eun-Ah Kim, Chungcheongnam-do (KR); Joon-Suk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/458,452

(22) Filed: Aug. 13, 2014

(65) Prior Publication Data

US 2015/0060809 A1 Mar. 5, 2015

(30) Foreign Application Priority Data

Aug. 30, 2013 (KR) .................. 10-2013-0104063

(51) Int. Cl.
*H01L 29/08* (2006.01)
*H01L 27/32* (2006.01)
*H01L 51/52* (2006.01)

(52) U.S. Cl.
CPC ........ *H01L 27/3246* (2013.01); *H01L 51/5228* (2013.01)

(58) Field of Classification Search
CPC .................. H01L 27/3246; H01L 51/5228
See application file for complete search history.

(56) References Cited

U.S. PATENT DOCUMENTS

| 2006/0119552 | A1* | 6/2006 | Yumoto | G09G 3/3283 345/76 |
| 2012/0205678 | A1* | 8/2012 | Ikeda | H01L 51/5203 257/88 |
| 2013/0056784 | A1* | 3/2013 | Lee | H01L 27/3246 257/99 |

* cited by examiner

*Primary Examiner* — Vongsavanh Sengdara
(74) *Attorney, Agent, or Firm* — Morgan, Lewis & Bockius LLP

(57) ABSTRACT

An OLED display device includes a substrate, a driving thin film transistor (TFT) formed on the substrate, a passivation layer formed over the substrate and covering the driving TFT, an OLED display formed on the passivation layer, the OLED including a first electrode, an organic emitting layer and a second electrode, a base line formed on the passivation layer, a support pattern formed on the central portion of the base line, a first bank layer covering a boundary portion of each of the first electrode and the base line so as to expose a central portion of each of the first electrode and the base line, and a second bank layer formed on the support pattern. The organic emitting layer is formed on the first electrode, the first and second bank layers and the support pattern in a pixel region of the substrate, and is cut at a top edge portion of the support pattern to expose a portion of the base line, and the second electrode covers the organic emitting layer and is connected to the portion of the base line.

15 Claims, 4 Drawing Sheets

ORGANIC LIGHT EMITTING DIODE DISPLAY DEVICE AND METHOD OF FABRICATING THE SAME

CROSS-REFERENCE TO RELATED APPLICATIONS

The present application claims the benefit of priority of Korean Patent Application No. 10-2013-0104063 filed on Aug. 30, 2013, which is hereby incorporated by reference for all purposes as if fully set forth herein.

BACKGROUND OF THE INVENTION

1. Field of the Invention

The present disclosure relates to an organic light emitting diode display device and, more particularly, to an organic light emitting diode display device using a support pattern and a method of fabricating the organic light emitting diode display device.

2. Discussion of the Related Art

Among various flat panel displays (FPDs), an organic light emitting diode (OLED) display device has superior properties such as high luminance and low driving voltage. The OLED display device uses an emissive electroluminescent layer to realize a high contrast ratio and a thin profile, and is excellent at displaying a moving image because of a short response time of several micro seconds (μsec). Also, the OLED display device has no limitation on a viewing angle and is stable even in a low temperature. Since the OLED display device is driven by a low voltage of about 5V to about 15V in direct current (DC), it is easy to fabricate and design a driving circuit. Moreover, since a fabrication process of the OLED display device requires only a deposition apparatus and an encapsulating apparatus, the fabrication process of the OLED display device is simple.

In general, the OLED display devices are classified into a passive matrix type and an active matrix type. In a passive matrix type OLED display device, elements of scan lines and signal lines are formed in a matrix such that the scan lines and the signal lines cross each other. In addition, since the scan lines are sequentially driven, each pixel displays an instant luminance that is the same as a product of a required luminance and the number of the scan lines.

In an active matrix type OLED display device, a thin film transistor (TFT) that is a switching element turning on/off the pixel is formed in each pixel and a voltage applied to the pixel is stored in a storage capacitor. Since the storage capacitor supplies the voltage until a next frame, each pixel operates during a frame regardless of the number of scan lines. Since a required luminance is obtained even when a low voltage is applied, the active matrix type OLED has advantages such as low power consumption, high resolution and applicability for a large size. As a result, the active matrix type OLED display device has been widely used.

The active matrix type OLED display device includes a gate line, a data line and a power line. The gate line and the data line cross each other to define a pixel region, and the power line is parallel to and spaced apart from the data line. A switching thin film transistor (TFT), a driving TFT, a storage capacitor and a light emitting diode are formed in the pixel region. When a gate signal is applied to the gate line, the switching TFT is turned on and a data signal of the data line is supplied to a gate electrode of the driving TFT through the switching TFT. Since the driving TFT is turned on, a source voltage of the power line is supplied to the light emitting diode through the driving TFT, thereby emitting light.

When the driving TFT is turned on, a level of a current flowing through the light emitting diode from the power line is determined according to a turn-on degree of the driving TFT such that the light emitting diode displays various gray levels. Since the storage capacitor maintains the voltage of the gate electrode of the driving TFT when the switching TFT is turned off, the level of the current flowing through the light emitting diode is maintained until a next frame even when the switching TFT is turned off According to an emission direction of a light from the light emitting diode, the OLED display devices may be classified as top emission devices and bottom emission devices. Since an aperture ratio is reduced in the bottom emission OLED display device, the top emission OLED display device has been widely used.

In the top emission OLED display device, a semiconductor layer, a gate insulating layer, a gate electrode, an interlayer insulating layer and source and drain electrodes are sequentially formed on a first substrate to constitute the driving TFT. The source and drain electrodes are connected to the power line and the light emitting diode, respectively.

The light emitting diode includes first and second electrodes and an organic emitting layer between the first and second electrodes. The first electrode is connected to the driving TFT in each pixel region, and the second electrode is formed on an entire surface of the first substrate having the organic emitting layer. In addition, a second substrate facing the first substrate is formed on the second electrode for encapsulation.

The first electrode as an anode includes a material having a relatively high work function, and the second electrode as a cathode includes a material having a relatively low work function. For the top emission type, the second electrode of a top layer on the first substrate may have a transparent property with respect to visible light, and the first electrode under the second electrode may have a reflective property with respect to the visible light for improving light efficiency.

In general, since the material having the relatively low work function is an opaque metallic material, the second electrode of the opaque metallic material may be formed with a small thickness to have the transparent property. However, as the thickness of the second electrode decreases, a resistance of the second electrode increases and a base voltage drops to cause deterioration such as non-uniformity in luminance distribution.

SUMMARY OF THE INVENTION

Accordingly, the present invention is directed to an organic light emitting diode display device where a light of a uniform luminance is emitted and a method of fabricating the same that substantially obviate one or more of the problems due to limitations and disadvantages of the related art.

An object of the present invention is to provide an OLED display device that is capable of improving luminance uniformity.

Another object of the present invention is to provide a method of fabricating an OLED display device that is capable of improving luminance uniformity.

Additional advantages, objects, and features of the invention will be set forth in the description which follows, and in part will become apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an OLED display device includes a substrate, a driving thin film transistor (TFT) formed on the substrate, a passivation layer formed over the substrate and covering the driving TFT, an OLED display formed on the passivation layer, the OLED including a first electrode, an organic emitting layer and a second electrode, a base line formed on the passivation layer, a support pattern formed on the central portion of the base line, a first bank layer covering a boundary portion of each of the first electrode and the base line so as to expose a central portion of each of the first electrode and the base line, and a second bank layer formed on the support pattern. The organic emitting layer is formed on the first electrode, the first and second bank layers and the support pattern in a pixel region of the substrate, and is cut at a top edge portion of the support pattern to expose a portion of the base line, and the second electrode covers the organic emitting layer and is connected to the portion of the base line.

In another aspect of the present invention, a method for fabricating an OLED display device comprising forming a driving thin film transistor (TFT) a substrate, forming a passivation layer over the substrate and covering the driving TFT, forming an OLED display on the passivation layer, the OLED including a first electrode, an organic emitting layer and a second electrode, forming a base line on the passivation layer, forming a support pattern on the central portion of the base line, forming a first bank layer to cover a boundary portion of each of the first electrode and the base line so as to expose a central portion of each of the first electrode and the base line, and forming a second bank layer on a top surface of the support pattern, wherein the organic emitting layer is formed on the first electrode, the first and second bank layers and the support pattern in a pixel region of the substrate, and is cut at a top edge portion of the separator to expose a portion of the base line, and the second electrode covers the organic emitting layer and is connected to the portion of the base line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) in accordance with the invention and together with the description serve to explain the principles of the embodiments in accordance with the invention. In the drawings.

DETAILED DESCRIPTION OF THE ILLUSTRATED EMBODIMENTS

Reference will now be made in detail to exemplary embodiments, examples of which are illustrated in the accompanying drawings. The same reference numbers may be used throughout the drawings to refer to the same or like parts. In the following description, detailed descriptions of known functions and configurations incorporated herein will be omitted when it may obscure the subject matter of the present embodiments.

Hereinafter, the exemplary embodiments will be described in detail with reference to FIGS. 1 to 4F.

Figure 1:
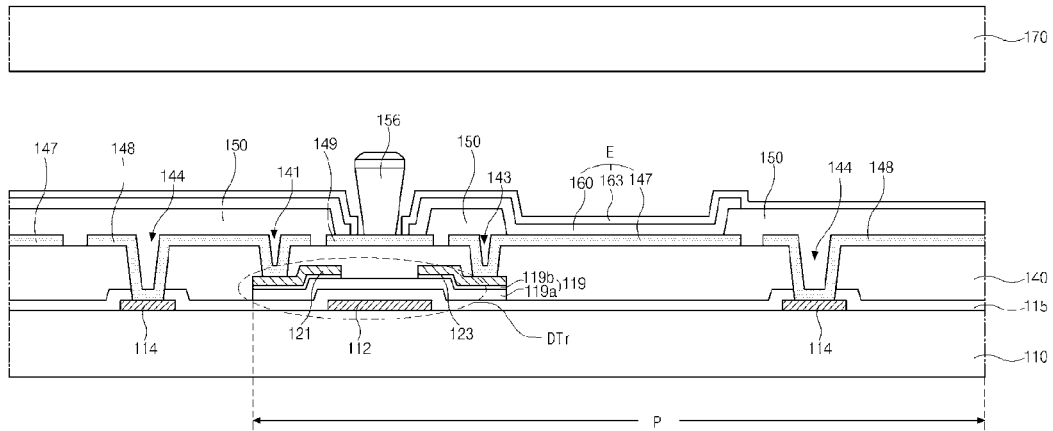
FIG. 1 is a cross-sectional view showing an organic light emitting diode display device according to a first embodiment.

FIG. 1 is a cross-sectional view showing an organic light emitting diode display device according to a first embodiment. With reference to FIG. 1, a top emission type organic light emitting diode display device according to the first embodiment includes a first substrate 110, a switching thin film transistor (TFT) (not shown), a driving TFT DTr and a light emitting diode E, and a second substrate 170 for encapsulation.

On the first substrate 110, a gate electrode 112, a gate line (not shown) and a power line 114 are formed. A gate insulating layer 115 is disposed on the first substrate 110 to cover the gate electrode 112, the gate line and the power line 114. The gate line and the power line 114 may be formed parallel to and spaced apart from each other. A semiconductor layer 119 is formed on the gate insulating layer 115 over the gate electrode 112, and source and drain electrodes 121 and 123 are formed on the semiconductor layer 119. The semiconductor layer 119 may include an active layer 119a of an intrinsic amorphous silicon and ohmic contact layers 119b of an impurity-doped amorphous silicon. The ohmic contact layers 119b are spaced apart from each other on the active layer 119a. The source and drain electrodes 121 and 123 are also spaced apart from each other. Moreover, a data line (not shown) is formed on the gate insulating layer 115 and crosses the gate line to define a pixel region P.

The gate electrode 112, the semiconductor layer 119 and the source and drain electrodes 121 and 123 may constitute the driving TFT DTr. The switching TFT may have the same structure as the driving TFT DTr. Each of the switching TFT and the driving TFT DTr of a bottom gate structure may have one of a negative type and a positive type. In addition, a gate signal may be applied to the gate line, a data signal may be applied to the data line, and a source voltage VDD may be applied to the power line 114.

Although not shown, a gate electrode of the switching TFT may be connected to the gate line, a source electrode of the switching TFT may be connected to the data line, and a drain electrode of the switching TFT may be connected to the gate electrode 112 of the driving TFT DTr.

A passivation layer 140 is formed on the switching TFT and the driving TFT DTr and has source and drain contact holes 141 and 143 exposing the source and drain electrodes 121 and 123, respectively. In addition, the passivation layer 140 and the gate insulating layer 115 have a first power contact hole 144 exposing the power line 114.

A first electrode 147 and an auxiliary power pattern 148 are formed on the passivation layer 140 in each pixel region P. The first electrode 147 is connected to the drain electrode 123 of the driving TFT DTr through the drain contact hole 143. In addition, the auxiliary power pattern 148 is connected to the source electrode 121 of the driving TFT DTr through the source contact hole 141 and is connected to the power line 114 through the first power contact hole 144. The first electrode 147 and the auxiliary power pattern 148 may be made of the same material and have the same layer as each other.

Further, a base line 149 is formed on the passivation layer 140 over the driving TFT DTr. A base voltage VSS may be applied to the base line 149. The base line 149 may be made of the same material and have the same layer as the first electrode 147 and the auxiliary power pattern 148.

The first electrode 147 may include a metallic material that has a relatively high work function to serve as an anode and a reflective property with respect to visible light to improve light efficiency. For example, the first electrode 147 may include one of aluminum (Al), aluminum alloy, silver (Ag), magnesium (Mg) and gold (Au). The auxiliary power pattern 148 and the base line 149 may include the same material as the first electrode 147. As a result, the first electrode 147, the auxiliary power pattern 148 and the base line 149 may be formed to have a relatively low resistance.

A bank layer 150 is formed on the first electrode 147, the auxiliary power pattern 148 and the base line 149. The bank layer 150 surrounds the pixel region P to cover a boundary portion of each of the first electrode 147 and the base line 149 and to expose a central portion of each of the first electrode 147 and the base line 149.

A separator 156 is formed on the base line 149 exposed through the bank layer 150. The separator 156 may have an inversed taper shape in a cross-sectional view and may include an organic material. For example, the separator 156 may be formed through a coating step, an exposure step and a developing step of a negative type photoresist (PR).

An organic emitting layer 160 is formed on the first electrode 147, the bank layer 150 and the separator 156 in each pixel region P. The organic emitting layer 160 contacts the central portion of the first electrode 147 exposed through the bank layer 150. In addition, the organic emitting layer 160 is cut at a top edge portion of the separator 156 such that the organic emitting layer 160 is formed on a top surface of the separator 156 and is not formed on a side surface of the separator 156 and a portion of the base line 149 covered with the top edge portion of the separator 156. As a result, the portion of the base line 149 is exposed through the organic emitting layer 160.

A second electrode 163 is formed on an entire surface of the first substrate 110 and fully covers the organic emitting layer 160. The second electrode 163 contacts and is connected to the portion of the base line 149 exposed through the organic emitting layer 160 due to the separator 156 in each pixel region P. The first and second electrodes 147 and 163 and the organic emitting layer 160 between the first and second electrodes 147 and 163 constitute the light emitting diode E.

The second electrode 163 may include a metallic material having a relatively low work function to serve as a cathode and a transparent property with respect to visible light to obtain a top emission type. As a result, the second electrode 163 may be formed to have a relatively small thickness and a relatively high resistance. For the purpose of reducing a drop of a base voltage VSS supplied to the second electrode 163, the second electrode 163 having a relatively high resistance is formed to contact the base line 149 having a relatively low resistance. Accordingly, the base voltage VSS having a uniform value without a voltage drop is supplied to the second electrode 163 in each pixel region P through the base line 149. Therefore, non-uniformity in luminance due to the high resistance of the second electrode 163 is prevented, thereby improving luminance uniformity.

In the OLED display device according to the first embodiment, the separator 156 is formed to have an inversed taper shape for separating the organic emitting layer 160. The inversed taper shape for the separator 156 might cause deterioration such as a breakdown or a peeling of the separator 156. For example, when an area ratio of a bottom surface to a top surface of the separator 156 is lower than about 0.5, the separator 156 might be broken down or be peeled off. In addition, since the separator is formed of a negative photoresist (PR), it is impossible to re-work the first substrate 110 having the deterioration of the separator 156.

As an improvement of the first embodiment, an OLED display device according to a second embodiment is provided.

Figure 2:
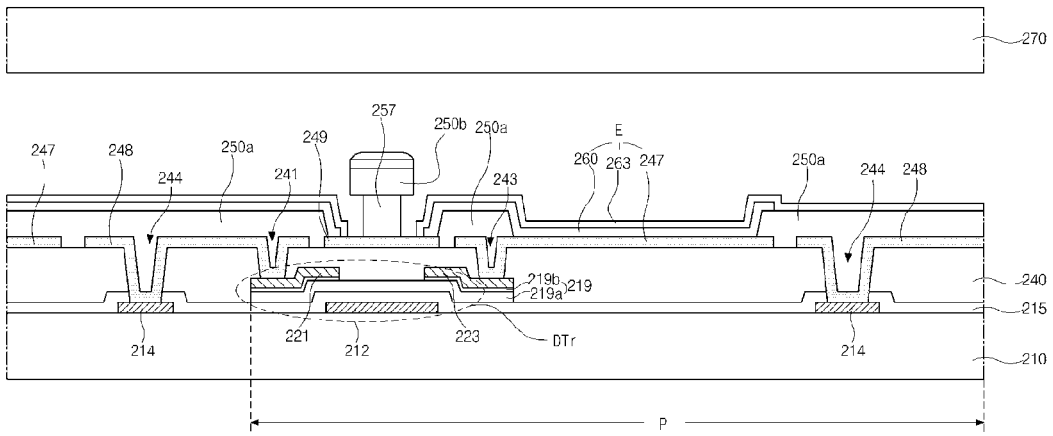
FIG. 2 is a cross-sectional view showing an organic light emitting diode display device according to a second embodiment.

FIG. 2 is a cross-sectional view showing an organic light emitting diode display device according to the second embodiment. With reference to FIG. 2, a top emission type organic light emitting diode display device includes a first substrate 210, a switching thin film transistor (TFT) (not shown), a driving TFT DTr and a light emitting diode E, and a second substrate 270 for encapsulation.

On the first substrate 110, a gate electrode 212, a gate line (not shown) and a power line 214 are formed. A gate insulating layer 215 is disposed on the first substrate and fully covers the gate electrode 212, the gate line and the power line 214. The gate line and the power line 214 may be formed parallel to and spaced apart from each other. A semiconductor layer 219 is formed one the gate insulating layer 215 over the gate electrode 212, and source and drain electrodes 221 and 223 are formed on the semiconductor layer 219. The semiconductor layer 219 may include an active layer 219a of an intrinsic amorphous silicon and ohmic contact layers 219b of an impurity-doped amorphous silicon. The ohmic contact layers 219b are spaced apart from each other on the active layer 219a. The source and drain electrodes 221 and 223 are spaced apart from each other. In addition, a data line (not shown) is formed on the gate insulating layer 215, and crosses the gate line to define a pixel region P.

The gate electrode 212, the semiconductor layer 219 and the source and drain electrodes 221 and 223 may constitute the driving TFT DTr and the switching TFT may have the same structure as the driving TFT DTr. Each of the switching TFT and the driving TFT DTr of a bottom gate structure may have one of a negative type and a positive type. In addition, a gate signal may be applied to the gate line, a data signal may be applied to the data line, and a source voltage VDD may be applied to the power line 214.

Although not shown, a gate electrode of the switching TFT may be connected to the gate line, a source electrode of the switching TFT may be connected to the data line, and a drain electrode of the switching TFT may be connected to the gate electrode 212 of the driving TFT DTr.

A passivation layer 240 is formed on the switching TFT and the driving TFT DTr and has source and drain contact holes 241 and 243 exposing the source and drain electrodes 221 and 223, respectively. In addition, the passivation layer 240 and the gate insulating layer 215 have a first power contact hole 244 exposing the power line 214.

A first electrode 247 and an auxiliary power pattern 248 are formed on the passivation layer 240 in each pixel region P. The first electrode 247 is connected to the drain electrode 223 of the driving TFT DTr through the drain contact hole 243. In addition, the auxiliary power pattern 248 is connected to the source electrode 221 of the driving TFT DTr through the source contact hole 241 and is connected to the power line 214 through the first power contact hole 244. The first electrode 247 and the auxiliary power pattern 248 may be made of the same material and have the same layer as each other.

Further, a base line 249 is formed on the passivation layer 240 over the driving TFT DTr. A base voltage VSS may be applied to the base line 249. The base line 249 may be made of the same material and have the same layer as the first electrode 247 and the auxiliary power pattern 248.

The first electrode 247 may include a metallic material that has a relatively high work function to serve as an anode and a reflective property with respect to visible light to improve light efficiency. For example, the first electrode 247 may include one of aluminum (Al), aluminum alloy, silver (Ag), magnesium (Mg) and gold (Au). The auxiliary power pattern 248 and the base line 249 may include the same material as the first electrode 247. As a result, the first electrode 247, the auxiliary power pattern 248 and the base line 249 may be formed to have a relatively low resistance.

A support pattern 257 is formed on the base line 249. A width of the support pattern 257 may be smaller than a width of the base line 249. Since the support pattern 257 having a width smaller than the base line 249 is formed within a perimeter of the base line 249, a portion of the base line 249 is exposed outside the support pattern 257.

The support pattern 257 may include an inorganic insulating material. For example, the support pattern 257 may be formed through a deposition step of a silicon oxide ($SiO_2$) layer or a silicon nitride (SiNx) layer, a coating step, an exposure step and a developing step of a photoresist (PR), and an etching step of the silicon oxide layer or the silicon nitride layer.

The support pattern 257 may have various shapes. For example, the support pattern 257 may have one of a direct taper shape, an inversed taper shape and a rectangular shape having a vertical sidewall in a cross-sectional view.

A first bank layer 250a is formed on the first electrode 247, the auxiliary power pattern 248 and the base line 249. A second bank layer 250b is formed on the support pattern 257. The first bank layer 250a surrounds the pixel region P to cover a boundary portion of each of the first electrode 247 and the base line 249 and to expose a central portion of each of the first electrode 247 and the base line 249. The second bank layer 250b have a width greater than the support pattern 257 to cover the support pattern 257 completely and to cover a portion of the base line 249 exposed outside the support pattern 257.

An organic emitting layer 260 is formed on the first electrode 247, the first bank layer 250a and the second bank layer 250b in each pixel region P. The organic emitting layer 260 contacts the central portion of the first electrode 247 exposed through the first bank layer 250a. In addition, the organic emitting layer 260 is cut at a top edge portion of the second bank layer 250b such that the organic emitting layer 260 is formed on a top surface of the second bank layer 250b and is not formed on a side surface of the second bank layer 250b and the support pattern 257 and a portion of the base line 249 covered with the top edge portion of the second bank layer 250b. As a result, the portion of the base line 249 is exposed through the organic emitting layer 260.

A second electrode 263 is formed on an entire surface of the first substrate 210 having the organic emitting layer 260. The second electrode 263 contacts and is connected to the portion of the base line 249 exposed through the organic emitting layer 260 due to the second bank layer 250b on the support pattern 257 in each pixel region P. The first and second electrodes 247 and 263 and the organic emitting layer 260 between the first and second electrodes 247 and 263 constitute the light emitting diode E.

The second electrode 263 may include a metallic material having a relatively low work function to serve as a cathode and a transparent property with respect to visible light to obtain a top emission type. As a result, the second electrode 263 may be formed to have a relatively small thickness and a relatively high resistance. For the purpose of reducing a drop of a base voltage VSS supplied to the second electrode 263, the second electrode 263 having a relatively high resistance is formed to contact the base line 249 having a relatively low resistance. Accordingly, the base voltage VSS having a uniform value without a voltage drop is supplied to the second electrode 263 in each pixel region P through the base line 249. Therefore, non-uniformity in luminance due to the high resistance of the second electrode 263 is prevented, thereby improving luminance uniformity.

In the OLED display device according to the second embodiment, the base line 249 may be shared with two adjacent pixel regions P, and the shapes of the support pattern 257 and the second bank layer 250b may be determined according to the structure of the two adjacent pixel regions P.

Figure 3A:
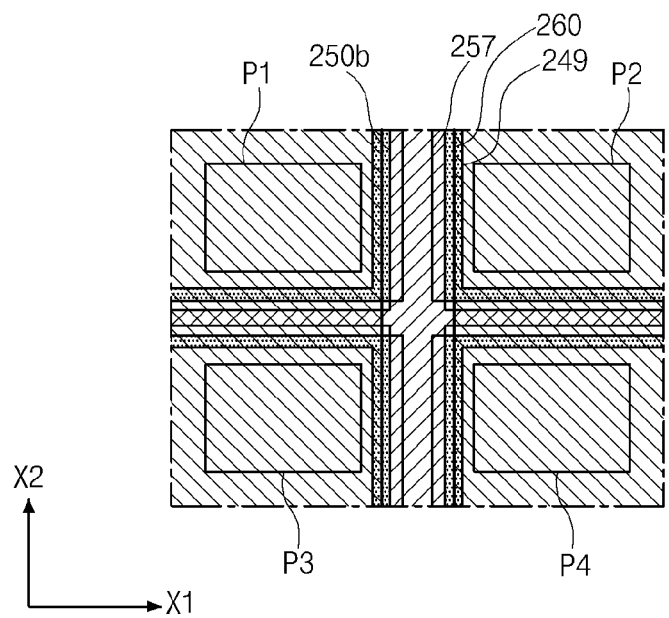
FIGS. 3A and 3B are plan views showing an organic light emitting diode display device according to second and third embodiments, respectively.
Figure 3B:
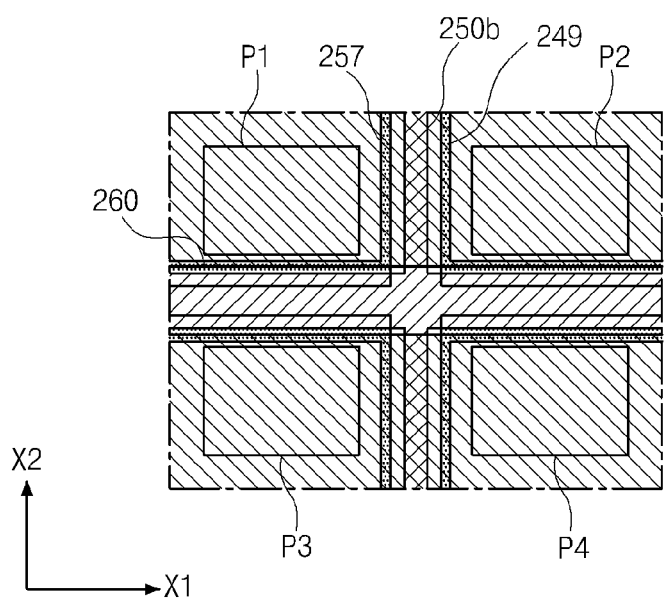

FIGS. 3A and 3B are plan views showing an organic light emitting diode display device according to second and third embodiments, respectively. The OLED display device according to the third embodiment has the same structure as the OLED display device according to the second embodiment except the support pattern and the second bank layer.

With reference to FIGS. 3A and 3B, the support pattern 257 and the second bank layer 250b on the support pattern 257 are formed to have a matrix shape along first and second directions X1 and X2 among first to fourth pixel regions P1 to P4. In addition, the base line 249 under the support pattern 257 is formed to have a matrix shape along the first and second directions X1 and X2. The first and second directions X1 and X2 may be parallel to the gate line and the data line, respectively.

In FIG. 3A, a width of the second bank layer 250b is smaller than a width of the support pattern 257 along the first direction X1, and a width of the second bank layer 250b is greater than a width of the support pattern 257 along the second direction X2. Since the second bank layer 250b and the support pattern 257 along the first direction X1 have a cross-sectional shape such that an upper portion is narrower than a lower portion, the organic emitting layer 260 is not cut by the second bank layer 250b and the support pattern 257 along the first direction X1 to cover the second bank layer 250b and the support pattern 257 along the first direction X1 completely. In addition, since the second bank layer 250b and the support pattern 257 along the second direction X2 have a cross-sectional shape such that an upper portion is wider than a lower portion, the organic emitting layer 260 is cut by the second bank layer 250b and the support pattern 257 along the second direction X2.

As a result, the base line 249 is not exposed through the organic emitting layer 260 in a border portion along the first direction X1 between the first and third pixel regions P1 and P3 and between the second and fourth pixel regions P2 and P4, and the base line 249 is exposed through the organic emitting layer 260 in a border portion along the second direction X2 between the first and second pixel regions P1 and P2 and between the third and fourth pixel regions P3 and P4. Accordingly, the second electrodes 263 (of FIG. 2) of the first and second pixel regions P1 and P2 contact and share the exposed base line 249 along the second direction X2, and the second electrodes 263 of the third and fourth pixel regions P3 and P4 contact and share the exposed base line 249 along the second direction X2.

In the OLED display device of FIG. 3A, the two adjacent pixel regions P along the first direction X1 share the base line 249 along the second direction X2.

In FIG. 3B, a width of the second bank layer 250b is greater than a width of the support pattern 257 along the first direction X1, and a width of the second bank layer 250b is smaller than a width of the support pattern 257 along the second direction X2. Since the second bank layer 250b and the support pattern 257 along the first direction X1 have a cross-sectional shape such that an upper portion is wider than a lower portion, the organic emitting layer 260 is cut by the second bank layer 250b and the support pattern 257 along the first direction X1. In addition, since the second bank layer 250b and the support pattern 257 along the second direction X2 have a cross-sectional shape such that an upper portion is smaller than a lower portion, the organic emitting layer 260 is not cut by the second bank layer 250b and the support pattern 257 along the second direction X2 to cover the second bank layer 250b and the support pattern 257 along the second direction X2 completely.

As a result, the base line 249 is exposed through the organic emitting layer 260 in a border portion along the first direction X1 between the first and third pixel regions P1 and P3 and between the second and fourth pixel regions P2 and P4. The base line 249 is not exposed through the organic emitting layer 260 in a border portion along the second direction X2 between the first and second pixel regions P1 and P2 and between the third and fourth pixel regions P3 and P4. Accordingly, the second electrodes 263 of the first and third pixel regions P1 and P3 contact and share the exposed base line 249 along the first direction X1, and the second electrodes 263 of the second and fourth pixel regions P2 and P4 contact and share the exposed base line 249 along the first direction X1.

In the OLED display device of FIG. 3B, the two adjacent pixel regions P along the second direction X2 share the base line 249 along the first direction X1.

Although not shown, when a width of the second bank layer 250b is greater than a width of the support pattern 257 along the first and second directions X1 and X2, the four pixel regions P along the first and second directions X1 and X2 share the base line 249 along the first and second directions X1 and X2.

A method of fabricating an OLED display device will be illustrated with reference to drawings hereinafter.

FIGS. 4A to 4F are cross-sectional views showing a method of fabricating an organic light emitting diode display device according to an exemplary embodiment.

Figure 4A:
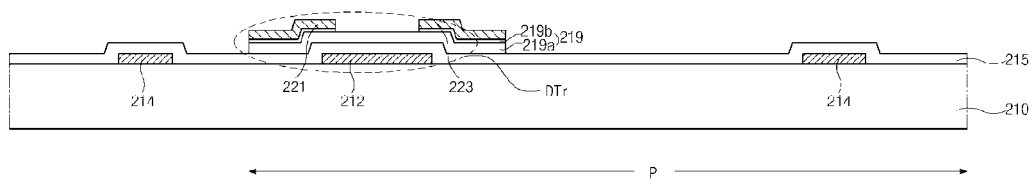
FIGS. 4A to 4F are cross-sectional views showing a method of fabricating an organic light emitting diode display device according to the second embodiment.

With reference to FIG. 4A, a driving TFT DTr is formed on a first substrate 210. The driving TFT DTr includes a gate electrode 212, a gate insulating layer 215, a semiconductor layer 219 and source and drain electrodes 221 and 223. Although not shown, a switching TFT may be formed simultaneously with the driving TFT DTr, and a gate line and a power line 214 may be formed simultaneously with the gate electrode 212.

Figure 4B:
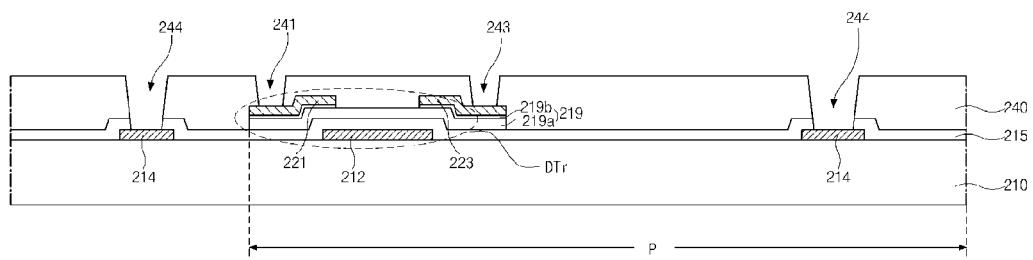

In FIG. 4B, a passivation layer 240 is formed on the driving TFT DTr. The passivation layer 240 has source and drain contact holes 241 and 243 exposing the source and drain electrodes 221 and 223, respectively. In addition, the passivation layer 240 and the gate insulating layer 215 have a first power contact hole 244 exposing the power line 214. The passivation layer 240 may include an inorganic insulating material such as silicon oxide ($SiO_2$) and silicon nitride ($SiNx$).

Figure 4C:
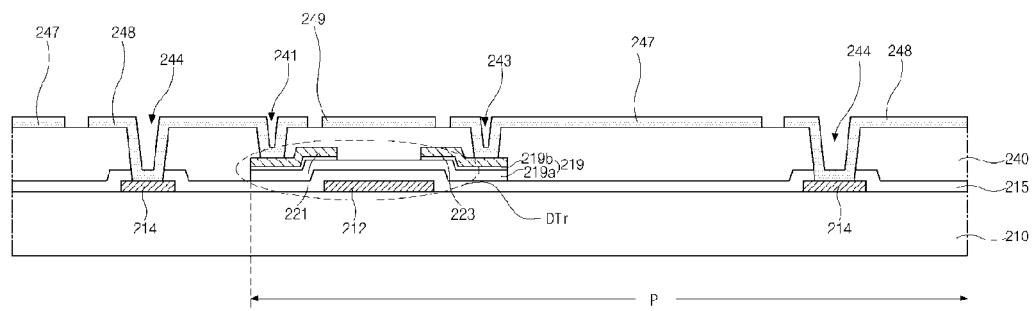

In FIG. 4C, a first electrode 247, an auxiliary power pattern 248 and a base line 249 are formed on the passivation layer 240 in each pixel region P. The first electrode 247 is connected to the drain electrode 223 of the driving TFT DTr through the drain contact hole 243. In addition, the auxiliary power pattern 248 is connected to the source electrode 221 of the driving TFT DTr through the source contact hole 241 and is connected to the power line 214 through the first power contact hole 244. The base line 249 may be disposed to correspond to a border portion between the adjacent pixel regions P.

Figure 4D:
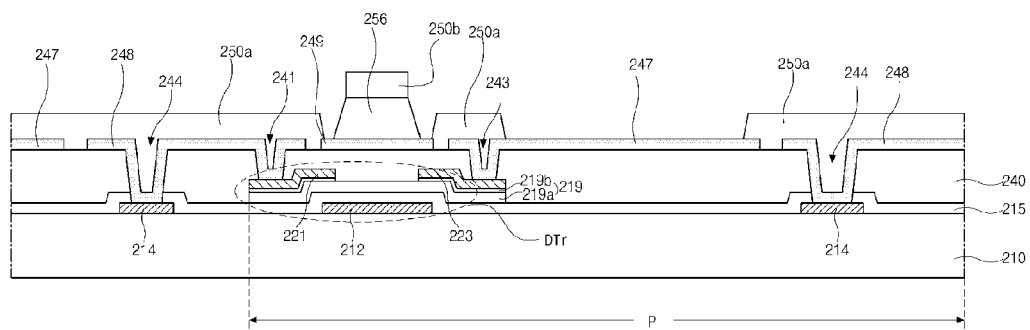

In FIG. 4D, a sacrificing pattern 256 is formed on the base line 249. The sacrificing pattern 256 may include an inorganic insulating material such as silicon compound, silicon oxide ($SiO_2$) and silicon nitride ($SiNx$). In addition, the sacrificing pattern 256 may have a thickness greater than a thickness of an organic emitting layer 260 (of FIG. 4F) formed in a subsequent process.

Further, a first bank layer 250a is formed on the first electrode 247, the auxiliary power pattern 248 and the base line 249, and a second bank layer 250b is formed on the sacrificing pattern 256. The first bank layer 250a surrounds the pixel region P to cover a boundary portion of each of the first electrode 247 and the base line 249 and to expose a central portion of each of the first electrode 247 and the base line 249. The second bank layer 250b may be formed within a perimeter of a top surface of the sacrificing pattern 256. For example, the first and second bank layers 250a and 250b may have a thickness of about 1 μm.

Figure 4E:
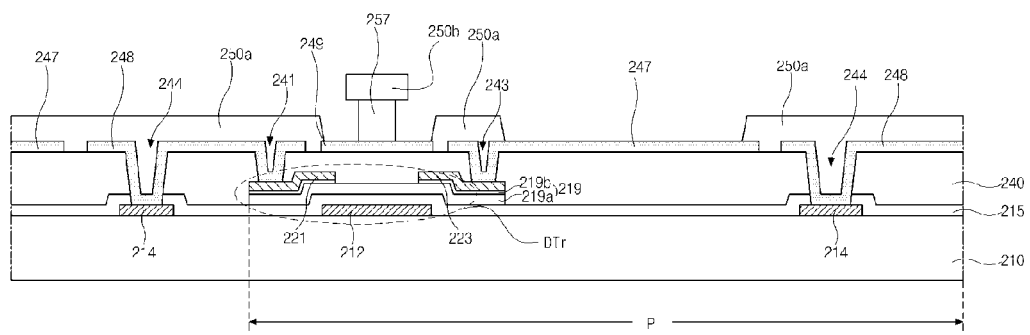

In FIG. 4E, a support pattern 257 is formed by etching the sacrificing pattern 256 such that a width of the sacrificing pattern 256 is reduced. For example, the sacrificing pattern 256 may be etched through a dry etching method or a wet etching method. A width of the support pattern 257 may be smaller than a width of the second bank layer 250b. Since the support pattern 257 having a width smaller than the base line 249 is formed within a perimeter of the base line 249, a portion of the base line 249 is exposed outside the support pattern 257. In addition, the support pattern 257 supporting the second bank layer 250b may have a thickness greater than a thickness of an organic emitting layer 260 formed in a subsequent process.

Since the support pattern 257 is formed by etching the sacrificing pattern 256 under the second bank layer 250b, the support pattern 257 may have various shapes without limitation due to deterioration such as a breakdown or a peeling. As a result, degree of freedom in design increases and aperture ratio is improved.

Figure 4F:
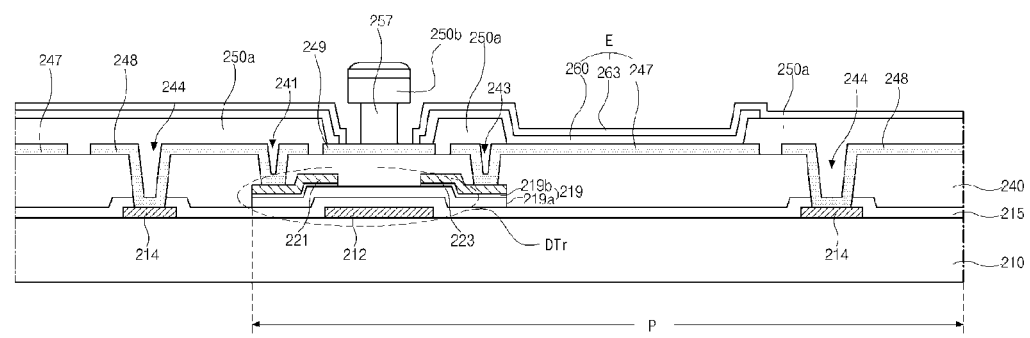

In FIG. 4F, an organic emitting layer 260 is formed on the first electrode 247, the first bank layer 250a and the second bank layer 250b in each pixel region P. The organic emitting layer 260 contacts the central portion of the first electrode 247 exposed through the first bank layer 250a. In addition, the organic emitting layer 260 is cut at a top edge portion of the second bank layer 250b such that the organic emitting layer 260 is formed on a top surface of the second bank layer 250b and is not formed on a side surface of the second bank layer 250b and the support pattern 257 and a portion of the base line 249 covered with the top edge portion of the second bank layer 250b. As a result, the portion of the base line 249 is exposed through the organic emitting layer 260.

In addition, a second electrode 263 is formed on an entire surface of the first substrate 210 having the organic emitting layer 260. The second electrode 263 contacts and is connected to the portion of the base line 249 exposed through the organic emitting layer 260 due to the second bank layer 250b on the support pattern 257 in each pixel region P. The first and second electrodes 247 and 263 and the organic emitting layer 260 between the first and second electrodes 247 and 263 constitute the light emitting diode E.

Although the second electrode 263 is formed to have a relatively small thickness and a relatively high resistance, a base voltage VSS having a uniform value without a voltage drop is supplied to the second electrode 263 because the second electrode 263 contacts the base line 249 having a relatively low resistance. Therefore, non-uniformity in luminance due to the high resistance of the second electrode 263 is prevented, thereby improving luminance uniformity.

Although not shown, a second substrate 270 is attached to the first substrate 210 having the driving TFT DTr and the light emitting diode E for encapsulation to complete the OLED display device.

Consequently, in an OLED display device according to the present disclosure, since the second electrode having a relatively high resistance is connected to the base line having a relatively low resistance, luminance uniformity is improved. In addition, since the support pattern is formed by etching the sacrificing pattern under the second bank layer, degree of freedom in design increases and aperture ratio is improved without limitation of the shape of the support pattern.

It will be apparent to those skilled in the art that various modifications and variations can be made in an OLED display device and a method of fabricating the OLED display device of the present disclosure without departing from the sprit or scope of the invention. Thus, it is intended that the present invention covers the modifications and variations of this invention provided they come within the scope of the appended claims and their equivalents.

What is claimed is:

1. An OLED display device, comprising:
    a substrate;
    a driving thin film transistor (TFT) formed on the substrate;
    a passivation layer formed over the substrate and covering the driving TFT;
    an OLED display formed on the passivation layer, the OLED including a first electrode, an organic emitting layer and a second electrode;
    a base line formed on the passivation layer;
    a support pattern formed on the central portion of the base line;
    a first bank layer covering a boundary portion of each of the first electrode and the base line so as to expose a central portion of each of the first electrode and the base line; and
    a second bank layer formed on a top surface of the support pattern,
    wherein
    the organic emitting layer is formed on the first electrode, the first and second bank layers and the support pattern in a pixel region of the substrate, and is cut at a top edge portion of the support pattern to expose a portion of the base line,
    the second electrode covers the organic emitting layer and is connected to the portion of the base line, and
    the second bank layer has a same material as the first bank layer.

2. The OLED display device according to claim 1, wherein a width of the second bank layer is smaller than a width of the support pattern along a first direction that is a horizontal direction of the substrate, whereas a width of the second bank layer is greater than a width of the support pattern along a second direction that is perpendicular to the first direction.

3. The OLED display device according to claim 1, wherein a width of the second bank layer is greater than a width of the support pattern along a first direction that is a horizontal direction of the substrate, whereas a width of the second bank layer is smaller than a width of the support pattern along a second direction that is perpendicular to the first direction.

4. The OLED display device according to claim 1, wherein the second bank layer has a width greater than the support pattern to cover entirely the support pattern.

5. The OLED display device according to claim 1, wherein the support pattern includes an inorganic insulating material.

6. The OLED display device according to claim 1, wherein the support pattern is positioned to overlap with the driving thin film transistor (TFT).

7. The OLED display device according to claim 1, wherein the second bank layer is disposed in direct contact with the top surface of the support pattern.

8. A method of fabricating an OLED display device, comprising:
    forming a driving thin film transistor (TFT) on a substrate;
    forming a passivation layer over the substrate and covering the driving TFT;
    forming an OLED display on the passivation layer, the OLED including a first electrode, an organic emitting layer and a second electrode;
    forming a base line on the passivation layer;
    forming a support pattern on the central portion of the base line;
    forming a first bank layer to cover a boundary portion of each of the first electrode and the base line so as to expose a central portion of each of the first electrode and the base line; and
    forming a second bank layer on a top surface of the support pattern,
    wherein
    the organic emitting layer is formed on the first electrode, the first and second bank layers and the support pattern in a pixel region of the substrate, and is cut at a top edge portion of the separator to expose a portion of the base line,
    the second electrode covers the organic emitting layer and is connected to the portion of the base line, and
    the second bank layer has a same material as the first bank layer.

9. The method according to claim 8, wherein a width of the second bank layer is smaller than a width of the support pattern along a first direction that is a horizontal direction of the substrate, whereas a width of the second bank layer is greater than a width of the support pattern along a second direction that is perpendicular to the first direction.

10. The method according to claim 8, wherein a width of the second bank layer is greater than a width of the support pattern along a first direction that is a horizontal direction of the substrate, whereas a width of the second bank layer is smaller than a width of the support pattern along a second direction that is perpendicular to the first direction.

11. The method according to claim 8, wherein the second bank layer has a width greater than the support pattern to cover entirely the support pattern.

12. The method according to claim 8, wherein the support pattern includes an inorganic insulating material.

13. The method according to claim 8, wherein forming the support pattern and forming the first and second bank layers comprises:
    forming a sacrificing pattern on the base line;
    forming the first bank layer on the first electrode and the base line and forming the second bank layer on the sacrificing pattern; and
    forming the support pattern by etching the sacrificing pattern such that a width of the support pattern is smaller than a width of the second bank layer.

14. The method according to claim 8, wherein the support pattern is positioned to overlap with the driving thin film transistor (TFT).

15. The method according to claim 8, wherein the second bank layer is disposed in direct contact with the top surface of the support pattern.

* * * * *